United States Patent
Nobutoki et al.

(10) Patent No.: US 8,674,046 B2
(45) Date of Patent: *Mar. 18, 2014

(54) SOURCE MATERIAL FOR PREPARING LOW DIELECTRIC CONSTANT MATERIAL

(75) Inventors: Hideharu Nobutoki, Tokyo (JP); Teruhiko Kumada, Tokyo (JP); Toshiyuki Toyoshima, Tokyo (JP); Naoki Yasuda, Tokyo (JP); Suguru Nagae, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 26 days.

This patent is subject to a terminal disclaimer.

(21) Appl. No.: 12/558,810

(22) Filed: Sep. 14, 2009

(65) Prior Publication Data

US 2010/0004425 A1    Jan. 7, 2010

Related U.S. Application Data

(62) Division of application No. 11/107,800, filed on Apr. 18, 2005, which is a division of application No. 10/266,794, filed on Oct. 9, 2002, now Pat. No. 6,924,240.

(30) Foreign Application Priority Data

Oct. 9, 2001    (JP) .................................. 2001-311405

(51) Int. Cl.
 C08G 79/08    (2006.01)
 C08G 73/06    (2006.01)
 C08G 79/00    (2006.01)
 C08G 73/00    (2006.01)

(52) U.S. Cl.
 USPC ................... 528/7; 528/4; 528/394; 528/423; 564/10

(58) Field of Classification Search
 USPC .............................. 528/394, 7, 4, 423; 564/10
 See application file for complete search history.

(56) References Cited

U.S. PATENT DOCUMENTS 3,166,520 A    1/1965    English et al.
(Continued)

FOREIGN PATENT DOCUMENTS

JP    37-10599    8/1959
(Continued)

OTHER PUBLICATIONS

Cornu, David, "Conversion of B(NHCH3)3 into Boron Nitride and polyborazine fibers and tubular BN structures derived therefrom", J. Mater. Chem., 9 (1999) 757-761.
(Continued)

*Primary Examiner* — Duc Truong
(74) *Attorney, Agent, or Firm* — Leydig, Voit & Mayer Ltd.

(57) ABSTRACT

A low dielectric constant material having an excellent water resistance obtained by heat-treating a borazine compound of the formula (1-2):

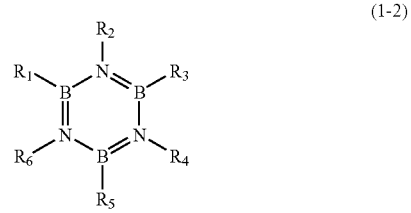

(1-2)

or an inorganic or organic compound having a group derived from the borazine compound (1-2) to undergo a condensation reaction, thereby producing an oligomer or polymer, wherein $R_1$ to $R_6$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group, an alkylphosphino group, or a group of the formula: $Si(OR_7)(OR_8)(OR_9)$, and at least one of $R_1$ to $R_6$ is not hydrogen atom.

2 Claims, 3 Drawing Sheets

(56) References Cited

U.S. PATENT DOCUMENTS

| | | |
|---|---|---|
| 3,288,726 A | 11/1966 | Wagner |
| 3,382,279 A | 5/1968 | Horn et al. |
| 4,581,468 A | 4/1986 | Paciorek et al. |
| 4,731,437 A | 3/1988 | Taniguchi et al. |
| 4,801,439 A | 1/1989 | Blum et al. |
| 4,906,763 A | 3/1990 | Paciorek et al. |
| 5,030,744 A | 7/1991 | Funayama et al. |
| 5,061,469 A | 10/1991 | Kimura |
| 5,175,020 A | 12/1992 | Doellein et al. |
| 5,202,399 A | 4/1993 | Sneddon et al. |
| 5,204,295 A | 4/1993 | Paine, Jr. et al. |
| 5,252,684 A | 10/1993 | Zank et al. |
| 5,316,986 A | 5/1994 | Blanchard et al. |
| 5,502,142 A | 3/1996 | Sneddon et al. |
| 5,855,962 A | 1/1999 | Cote et al. |
| 6,235,851 B1 | 5/2001 | Ishii et al. |
| 6,284,358 B1 | 9/2001 | Parlier et al. |
| 6,452,274 B1 | 9/2002 | Hasegawa et al. |
| 6,458,719 B1 | 10/2002 | Tsunoda et al. |
| 6,924,240 B2 | 8/2005 | Nobutoki et al. |
| 6,924,545 B2 | 8/2005 | Uchimaru et al. |
| 7,029,605 B2 | 4/2006 | Tsunoda et al. |
| 7,625,642 B2 | 12/2009 | Matsutani et al. |
| 2002/0000556 A1 | 1/2002 | Sakamoto et al. |
| 2002/0053653 A1 | 5/2002 | Tsunoda et al. |
| 2002/0058142 A1 | 5/2002 | Tsunoda et al. |
| 2002/0063338 A1 | 5/2002 | Mikami et al. |
| 2005/0181628 A1 | 8/2005 | Nobutoki et al. |
| 2010/0004425 A1 | 1/2010 | Nobutoki et al. |

FOREIGN PATENT DOCUMENTS

| | | |
|---|---|---|
| JP | 1-290510 A | 11/1989 |
| JP | 4-13730 A | 1/1992 |
| JP | 05-239648 A | 9/1993 |
| JP | 06-322133 A | 11/1994 |
| JP | 08-167650 A | 6/1996 |
| JP | 11-307633 A | 11/1999 |
| JP | 2000-058538 A | 2/2000 |
| JP | 2000-340689 A | 12/2000 |
| JP | 2001-015496 A | 1/2001 |
| JP | 2001-015595 A | 1/2001 |
| JP | 2002-317049 A | 10/2002 |

OTHER PUBLICATIONS

Extended Abstracts (The 62$^{nd}$ Autumn Meeting, 2001), The Japan Society of Applied Physics, No. 2, p. 877, Sep. 11-14, 2001, Evaluation of Low-K Polymer Film Containing Borazine-Unit.

Fazen et al., Chem. Mater., vol. 7, pp. 1942-1956 (1995).

Kajiwara, Naruyuki, Application View of Inorganic Polymer, pp. 70-84 (1990).

Kane et al., J. Electrochem. Soc., vol. 144, No. 2, pp. 658-663 (1997).

Kimura Yoshiharu, Sennito-Kogyo (Fiber and Industry), vol. 52, No. 8, pp. 341-346 (1996).

Kimura et al., Composites Science and Technology, vol. 51, pp. 173-179 (1994).

Maeda et al., Japanese Journal of Applied Physics, vol. 26, No. 5, pp. 660-665 (1987).

Narula et al., J. Am. Chem. Soc., vol. 109, pp. 5556-5557 (1987).

Nguyen et al., J. Electrochem. Soc., vol. 141, No. 6, pp. 1633-1638 (1994).

Paine et al., Recent Developments in Borazine-Based Polymers, "Inorganic and Organometallic Polymers", American Chemical Society, pp. 358-374 (1994).

Shih et al., Symposium on VLSI Technology Digest, pp. 83-84 (1997).

Shinmiyahara et al., Recent Development in Cu Wiring Technology, Realize Company, Japan (1998).

Yuk et al., U., "Evaluation of Low-k Polymer Film Containing Borazine-Unit", Extended Abstracts (The 48$^{th}$ Spring Meeting, 2001), The Japan Society of Applied Physics and Related Societies, Mar. 28-31, 2001, p. 877.

Office Action (translation-in-part) of Japanese Patent Application No. 2007/173966; pp. 1-11; Oct. 5, 2010.

Lynch et al., J. Am. Chen. Soc., 111: 6201-6209 (1989).

pp. 1364-1365 (1994).

The Society of Polymer Science, Japan; pp. 27-28 (1989).

Toeniskoetter et al., Inorganic Chemistry, 2(1): 29-36 (1963).

Uchimaru et al., Polymer Preprints, Japan 48(11): 2661-2662 (1999).

Tokyo Kagaku Dojin; *Kagaku Jiten* (Chemical Dictionary); pp. 1364-1365 (Oct. 1, 1996).

The 8$^{th}$ Muki Kobunshi Kenkyu Toronkai; *The Society of Polymer Science*, Japan; pp. 27-28 (Nov. 15-16, 1989).

"Better use of 'water' in your life," Clariant (Japan) K.K., Polysilazane Business Group (Date Unavailable).

Crystal Glaze Glass Body Coat, M.I.D. Inc. (Date Unavailable).

Dargere et al., "Hydridosilazanes hydrolysis-condensation reactions studied by $^1$H and $^{29}$Si liquid NMR spectroscopy," *J. Sol-Gel. Sci. Technol.*, 62, 389-396 (2012).

Dow Corning® Z-6079 Silazane, Material Safety Data Sheet, Sep. 11, 2012.

Paine et al., "Borazine-based polymers close in on commercial performance," *ChemTech*, 29-37 (1994).

Paine et al., "Synthetic routes to boron nitride," *Chemical Review*, 90, 73-91 (1990).

Uchimaru et al., "Evaluation of low-k polymer film containing borazine unit," *Extended Abstracts*, 656 (2001).

US 8,674,046 B2

SOURCE MATERIAL FOR PREPARING LOW DIELECTRIC CONSTANT MATERIAL

BACKGROUND OF THE INVENTION

The present invention relates to a material having a low dielectric constant (low k material) useful as an insulating film used for interlayer insulation of semiconductor elements, as a barrier metal layer or an etch stopper layer, or as a substrate for electric circuit parts, and also relates to an insulating film comprising this material and a semiconductor device having the insulating film.

Demands for high integration and high speed of semiconductor devices are increasing more and more. In order to meet these demands, there have been made a study on conductive layer materials having a lower electric resistance than conventional aluminum alloy, namely a study on wiring materials, and a study on insulating layer materials having a lower dielectric constant than conventional silicon oxide. In particular, these materials are needed in wiring of semiconductor devices if the structural minimum dimension of the semiconductor devices becomes smaller than about 0.18 μm, as known, for example, from "Recent Development in Cu Wiring Technology" edited by S. Shinmiyahara, N. Awaya, K. Ueno and N. Misawa published by Realize Company, Japan in 1998.

FIG. 5 is a section view showing a two layer copper wiring structure in a semiconductor device disclosed in the above publication. In the figure, numeral 1 is a silicon substrate, and numeral 2 is a first insulating layer having trench 3 corresponding to a first wiring pattern. The first insulating layer 2 is made of a silicon oxide film having a dielectric constant of 4.2 or a fluorine-containing silicon oxide film having a dielectric constant of 3.2 to 3.5. Further, studies have been made on applicability, as alternates, of materials having a lower dielectric constant than 2.8 such as silicon-based inorganic polymer materials, organic polymer materials, amorphous fluorine-containing carbon films and porous silicon oxide films. The bottom and the side faces of trench 3 are covered with first conductive film 4 having a diffusion preventive function as a barrier metal. As the first conductive film 4 is used titanium nitride (TiN), tantalum nitride (TaN), tungsten nitride (WN), or a trinary barrier metal comprising each of these nitrides and silicon. First copper conductive layer 5 is formed to fill the trench 3 covered with the first conductive film 4. Numeral 6 is a first insulating film having a diffusion preventive function against copper, which is made of silicon nitride. Numeral 7 is a second insulating layer, which is made of a material similar to that of the first insulating layer 2. A hole 8 is formed in the first insulating film 6 and the second insulating layer 7 therethrough, and the bottom and side surfaces of the hole 8 are covered with a second conductive film 9 having a diffusion preventive function and contacting the first copper conductive layer 5. The hole 8 which is covered with the second conductive film 9 is filled with a second copper conductive layer 10. A trench 12 corresponding to a second wiring pattern is also formed in the second insulating layer 7, and the inner surfaces of trench 12 are covered with third conductive film 11 having a diffusion preventive function. The trench 12 which is covered with the third conductive film 11 is filled with a third copper conductive layer 13. The second and third conductive films 9 and 11 are made of a material similar to that of the first conductive film 4. The upper surface of the third copper conductive layer 13 is covered with a second insulating film 14 made of silicon nitride having a diffusion preventive function against copper. The first and third copper conductive layers 5 and 13 constitute wiring in the lower layer and wiring in the upper layer respectively, and the second copper conductive layer 10 electrically connects these wirings in the upper and lower layers therebetween. While the wiring of two layer structure is shown in FIG. 4, this structure may be repeatedly stacked to form a multi-layer structure.

The wiring structure shown in FIG. 5 is formed through a so-called Damascene process, which will be described below.

Trench 3 corresponding to a wiring pattern is formed in first insulating layer 2, and first conductive film 4 which serves as a barrier metal, is formed on the inner surface of the trench 3. A copper film is is then formed on the first insulating layer 2 to fill the trench 3. Unnecessary barrier metal and copper films formed on portions other than the trench 3 are removed by CMP (chemical mechanical polishing) to leave the barrier metal and copper only in the trench 3 to form first copper conductive layer 5. In such a manner, the copper wiring in the lower layer is formed in the trench 3 with the bottom and side surfaces thereof covered with the first conductive film 4. Then, silicon nitride film 6 and second insulating layer 7 are sequentially stacked on the first insulating layer 2. Trench 12 having a pattern corresponding to the second wiring and hole 8 extending to the first copper conductive layer 5 are formed in the silicon nitride film 6 and the second insulating layer 7 therethrough. Second and third conductive films 9 and 11 are formed as the barrier metal on the surfaces of the trench 12 and the hole 8. The trench 12 and the hole 8 are then filled with copper by copper film forming, followed by removal of unnecessary copper and barrier metal on the second insulating layer 7 using CMP to thereby form the wiring in the upper layer. Thereafter, second insulating film 14 is formed.

In case that a polymeric material or a porous silicon oxide, which have a lower dielectric constant than silicon oxide and fluorine-containing silicon oxide, is used as a material for the first or second insulating layer or the first or second insulating film of semiconductor devices having the above wiring structure, a problem arises about deterioration in reliability of wiring and device, since these materials have a lower thermal conductivity as compared with conventionally used silicon oxide and heat generation in a wiring may cause temperature rise of semiconductor devices.

FIG. 6 is a section view showing a wiring structure in a semiconductor device disclosed in W. Y. Shih, M. C. Chang, R. H. Havemann and J. Levine, Symposium on VLSI Technology Digest, pages 83-84, 1997, wherein two kinds of insulative materials are used in the above-mentioned first and second insulating layers respectively in order to solve the problem associated with poor thermal conductivity.

That is to say, a material having a low dielectric constant such as a polymeric material is used as a material of insulating layers 15 and 16 in which wiring is formed by each of first copper conductive layer 5 and third copper conductive layer 13. On the other hand, silicon oxide which has a good thermal conductivity and has been conventionally used as an insulating material of a wiring-forming layer, is used as a material of insulating layer 18 in which hole 8 is formed and as a material of insulating layer 17 disposed between first copper wiring 5 and substrate 1, thereby suppressing deterioration in thermal conductivity as a whole. Numerals 4, 9 and 11 denote first, second and third conductive films respectively which are formed as a barrier metal. Numeral 10 is a second copper conductive layer filled in the hole 8. Numeral 12 is a trench, and numeral 14 is a second insulating film.

In the former publication, it is described that owing to scale down of pattern size associated with high integration of integrated circuits in semiconductor devices and owing to increase in wiring length resulting from increase in chip area, propagation delay of signals on wiring is growing to a major cause hindering advent of high speed devices. Solution of such a problem would require reduction in wiring resistance and use of insulating films having low dielectric constant for reduction in electrostatic capacitance between wirings, namely reduction in wiring capacitance. As a wiring material for this purpose, copper is beginning to be used in place of aluminum alloy used conventionally. On the other hand, as an interlayer dielectric for this purpose, a fluorine-containing silicon oxide film having a dielectric constant of 3.2 to 3.5, namely SiOF, is also beginning to be used in place of silicon oxide having a dielectric constant of 4.2.

However, in case of forming an interlayer insulating film from SiOF, its dielectric constant is from about 3.2 to about 3.5 and, therefore, the reduction in capacity between wirings and the prevention of propagation delay of signals on wiring are not sufficiently achieved, although the dielectric constant of interlayer insulating film becomes lower than conventional one.

With respect to interlayer insulating films formed from organic compounds, dielectric constant of 2.7 is achieved by a film of a polyimide into which fluorine atom is introduced or by an aryl ether polymer, but they are still unsatisfactory for use as an interlayer dielectric. A deposition film of parylene can achieve a dielectric constant of 2.4, but its thermal resistance is at most about 200-300° C. and, therefore, processes for the production of semiconductor elements are restricted.

Also, a porous $SiO_2$ film having a dielectric constant of 2.0 to 2.5 is reported, but it is poor in mechanical strength (resistance to CMP process) due to high porosity and has a problem that the pore size is not uniform.

Further, these polymeric materials and porous $SiO_2$ film have an inferior thermal conductivity as compared to conventional $SiO_2$ interlayer dielectrics and accordingly may cause a problem of deterioration in wiring life (electromigration) due to rise in temperature of wiring.

Use of copper as a wiring material requires covering the surface of copper wiring with a diffusion preventive film, since copper easily diffuses into insulating layers under application of an electric field. Therefore, in general, the lower and side surfaces of a copper wiring are covered with a conductive barrier metal, while the top surface thereof is covered with a silicon nitride insulating film. The dielectric constant of the silicon nitride film is about 7 and the resistance of the barrier metal is much higher than that of copper. Thus, the resistance value of the wiring as a whole increases to result in restriction on speeding up in operation of semiconductor devices.

The same problem is also encountered when a low dielectric constant material is used as an insulating film. In case of using low dielectric constant insulating films, conventional silicon oxide which has a good thermal conductivity is used as a material of a layer provided with a hole for connecting the upper wiring with the lower wiring in order to avoid reduction in reliability. Since the use of this silicon oxide layer further increases wiring capacitance, a problem arises that the propagation delay of signal is caused by increase in wiring capacitance, thus resulting in restriction on speeding up of semiconductor devices.

As a material having a low dielectric constant and a thermal resistance which would solve the problems as mentioned above, JP-A-2000-340689 and JP-A-2001-15496 propose low dielectric constant materials that have a borazine skeleton-based molecule in an inorganic or organic material molecule. However, the proposed low dielectric constant materials have the problem that since they are hydrolyzable, the water resistance is poor.

It is an object of the present invention to provide a low dielectric constant material free from the problems as mentioned above, particularly a low dielectric constant material having an excellent water resistance as well as a low dielectric constant and a high thermal resistance.

A further object of the present invention is to provide a low dielectric constant insulating film having an excellent water resistance suitable for use in semiconductor devices.

A still further object of the present invention is to provide a process for preparing a low dielectric constant material having an excellent water resistance as well as a low dielectric constant and a high thermal resistance.

Another object of the present invention is to provide a semiconductor device capable of operating in high speed and having a high reliability.

These and other objects of the present invention will become apparent from the description hereinafter.

SUMMARY OF THE INVENTION

In accordance with the first aspect of the present invention, there is provided a process for preparing a low dielectric constant material comprising the step of heat-treating an inorganic or organic compound containing in its molecule a borazine skeleton structure of the formula (1-1):

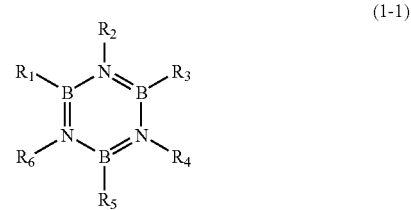

(1-1)

wherein at least one of $R_1$ to $R_6$ is a bond which binds said borazine skeleton structure to the molecule of said inorganic or organic compound, and $R_1$ to $R_6$ other than said bond are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group, an alkylphosphino group or a group of the formula: $Si(OR_7)(OR_8)(OR_9)$ in which $R_7$ to $R_9$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group or an alkylphosphino group, provided that at least one of $R_1$ to $R_6$ other than said bond is not a hydrogen atom.

In accordance with the second aspect of the present invention, there is provided a process for preparing a low dielectric constant material comprising the step of heat-treating a borazine skeleton-containing compound of the formula (1-2):

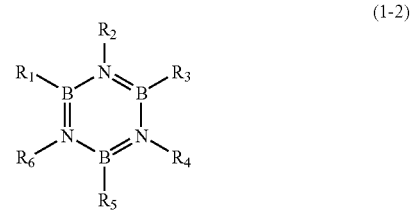

(1-2)

wherein $R_1$ to $R_6$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group, an alkylphosphino group, or a group of the formula: $Si(OR_7)(OR_8)(OR_9)$ in which $R_7$ to $R_9$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group or an alkylphosphino group, and at least one of $R_1$ to $R_6$ is not a hydrogen atom.

Low dielectric constant materials having an excellent water resistance as well as a low dielectric constant and a high thermal resistance can be obtained by the above first and second processes.

Thus, the present invention provides a low dielectric constant material (material I) comprising a polymeric or oligomeric, inorganic or organic material having in its molecule a borazine skeleton structure represented by any of the formulas (2) to (4):

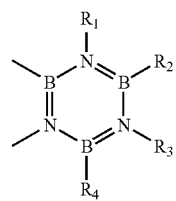

(2)

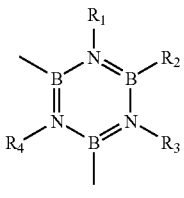

(3)

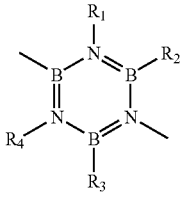

(4)

wherein $R_1$ to $R_4$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group, an alkylphosphino group, or a group of the formula: $Si(OR_7)(OR_8)(OR_9)$ in which $R_7$ to $R_9$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group or an alkylphosphino group, provided that at least one of $R_1$ to $R_4$ is not a hydrogen atom.

The present invention also provides a low dielectric constant material (material II) obtained by condensation of the compound (1-2), that is, a low dielectric constant material having a borazine skeleton-based structure formed by bonding a first borazine skeleton structure represented by any one of the formulas (2) to (4) described below with a second borazine skeleton structure represented by any one of the formulas (2) to (4) with elimination of hydrogen atoms from each of the first and second borazine skeleton structure to form a third borazine skeleton structure:

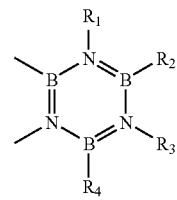

(2)

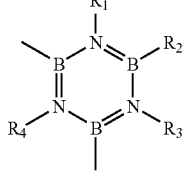

(3)

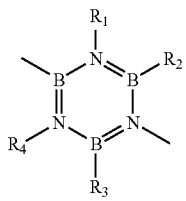

(4)

wherein $R_1$ to $R_4$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group, an alkylphosphino group, or a group of the formula: $Si(OR_7)(OR_8)(OR_9)$ in which $R_7$ to $R_9$ are independently a hydrogen atom, an alkyl group having 1 to 20 carbon atoms, an aryl group, a substituted aryl group, an alkenyl group, an amino group, an alkylamino group, an alkoxyl group, a thioalkoxyl group, a carbonyl group, a silyl group, an alkylsilyl group, a phosphino group or an alkylphosphino group, provided that at least one of $R_1$ to $R_4$ is not a hydrogen atom.

The low dielectric constant materials of the present invention are useful as an insulating film for use in semiconductor devices, and semiconductor devices having excellent properties are obtained by the use thereof.

Thus, in accordance with another aspect of the present invention, there is provided an insulating film comprising the above-mentioned low dielectric constant material I or II.

In accordance with still another aspect of the present invention, there is provided a semiconductor device including such insulating film. The semiconductor devices of the present invention are operable at high speed.

In a first embodiment of the semiconductor devices according to the present invention, the semiconductor device comprises a semiconductor substrate, a first insulating layer having a first trench and being formed on the surface of said semiconductor substrate, a first copper conductive layer formed so as to fill said first trench, a second insulating layer having a hole communicating with said first copper conductive layer, a second copper conductive layer filled in said hole so as to contact with said first copper conductive layer, a third insulating layer formed on said second insulating layer and having a second trench communicating with said second copper conductive layer, and a third copper conductive layer contacting said second copper conductive layer and being formed so as to fill said second trench formed in said third insulating layer, wherein at least one of said first, second and third insulating layers is made of an insulating material comprising the above-mentioned low dielectric constant material I or II.

In a second embodiment of the semiconductor devices according to the present invention, the semiconductor device comprises a semiconductor substrate, a first insulating layer having a first trench and formed on the surface of said semiconductor substrate, a first copper conductive layer formed so as to fill said first trench, an insulating film which has a first hole communicating with said first copper conductive layer and which covers said first copper conductive layer and said first insulating layer, a second insulating layer having a second hole communicating with said first hole and having a second trench communicating with said second hole, a second copper conductive layer filling said first and second holes so as to contact with said first copper conductive layer, and a third copper conductive layer contacting with said second copper conductive layer and being formed so as to fill said second trench formed in said second insulating layer, wherein said insulating film is made of an insulating material comprising the above-mentioned low dielectric constant material I or II.

In the above embodiments, from the viewpoints that the production of semiconductor devices is easy and the reliability of the devices is high, it is preferable that the low dielectric constant material I or II in the insulating material is amorphous. Also, from the viewpoints of excellent mechanical strength and high heat resistance, it is preferable that the low dielectric constant material I or II in the insulating material is a mixture of a microcrystalline material and an amorphous material.

In the semiconductor device according to the first embodiment, from the viewpoint that the thermal conductivity is excellent and accordingly the reliability is improved, it is preferable that at least one of the first, second and third insulating layers is made of silicone oxide. Also, from the viewpoint that wiring having a good shape is obtained and accordingly the reliability is improved, it is preferable that at least one of the first, second and third insulating layers is made of an aryl ether polymer.

DETAILED DESCRIPTION

Figure 1:
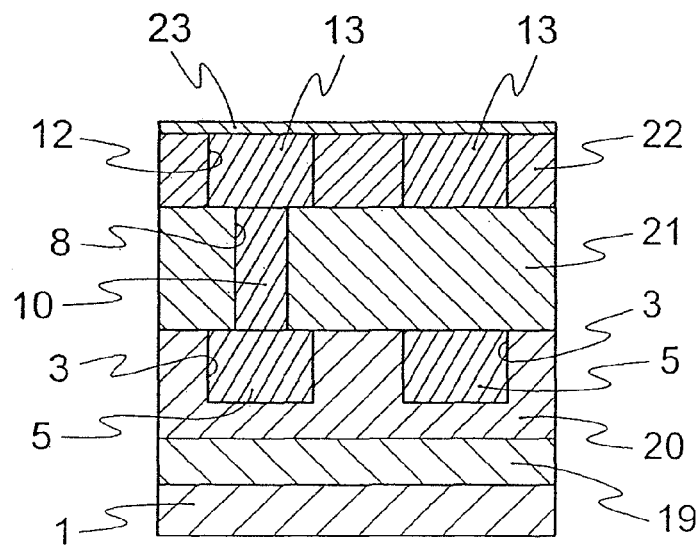
FIG. 1 is a sectional view showing a wiring structure of a semiconductor device according to an embodiment of the present invention.

The low dielectric constant materials of the present invention are prepared by subjecting a borazine derivative as a starting material, i.e., an inorganic or organic compound containing a borazine skeleton structure of the formula (1-1) in its molecule or a substituted borazine (1-2), to a condensation reaction to produce an oligomer or polymer containing the borazine skeleton structure.

The preparation of the low dielectric constant materials is carried out, for example, according to the procedures as described in Yoshiharu Kimura, Senni-to-Kogyo (Fiber and Industry), Vol. 52, No. 8, 341-346 (1996); Paine & Sneddon, Recent Developments in Borazine-Based Polymers, "Inorganic and Organometallic Polymers", American Chemical Society, 358-374 (1994); and Fazen et al., Chem. Mater., Vol. 7, p 1942 (1995). That is, the low dielectric constant materials can be obtained by heating a borazine derivative as the starting material to undergo a condensation reaction, or by firstly synthesizing a prepolymer in such a manner and then polymerizing it. In general, the condensation reaction is carried out by heating the starting material in an organic solvent at a temperature of 50 to 400° C., preferably 70 to 180° C. for 1 to 240 hours, preferably in an inert gas atmosphere such as argon.

In the preparation of low dielectric constant materials is used an organic solvent which can homogeniously disperse or dissolve borazine, borazine derivatives as mentioned above or borazine-based prepolymers, e.g., an alcohol such as methanol, ethanol, propanol or butanol, acetone, benzene, toluene, xylene, glyme and others.

An example of the substituted borazine (1-2) is B-triethylaminoborazine. B-triethylaminoborazine can be prepared, for example, by reacting B-trichloroborazine with ethylamine in toluene at an elevated temperature, e.g., 70° C., for several hours, e.g., 4 hours, and removing ethylamine hydrochloride and the solvent.

In the inorganic or organic compound containing a borazine skeleton structure of the formula (1-1) in its molecule, the inorganic compound to which the substituted borazine (1-2) is bound includes, for instance, silicate, silazane, silsequioxane, siloxane, silane and the like. The organic compound to which the substituted borazine (1-2) is bound includes, for instance, poly(aryl ether), parylene, polyphenylene, polyphenylenevinylene, polybenzocyclobutene, polyimide, polyester, polystyrene, polymethylstyrene, polymethyl acrylate, polymethyl methacrylate, polycarbonate, adamantane, norbornene, and the like.

The low dielectric constant materials of the present invention can also be obtained by a chemical vapor deposition method, as described after, using a boron source, a nitrogen source and a carbon or the like source such as methane, a chemical vapor deposition method using a substituted borazine such as methylborazine or ethylborazine, or by methods as disclosed in C. K. Narula et al., J. Am. Chem. Soc., Vol. 109, p 5556 (1987) and Y. Kimura et al., Composites Science and Technology, Vol. 51, p 173 (1994).

The low dielectric constant materials of the present invention prepared from the inorganic or organic compound containing in its molecule the borazine skeleton structure shown by the formula (1-1) are inorganic or organic oligomers or polymers containing a borazine skeleton structure shown by the formula (2), (3) or (4) in the molecule thereof. These oligomers and polymers have a lower dielectric constant than silicon oxide and fluorine-containing silicon oxide, and an excellent water resistance. They are composed of, as a main component, boron nitride which has a copper diffusion preventing function and accordingly can prevent diffusion of copper.

Examples of the borazine skeleton structures included in the oligomers or polymers are those having the formulas (5) to (116) shown below.

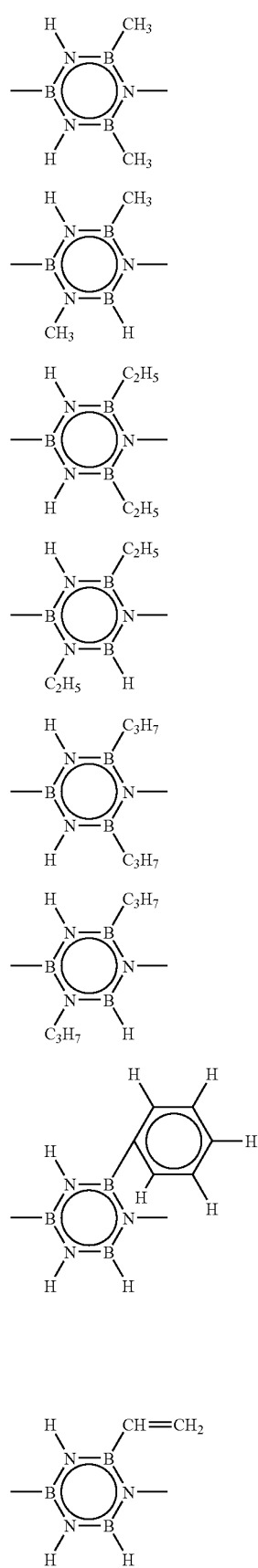
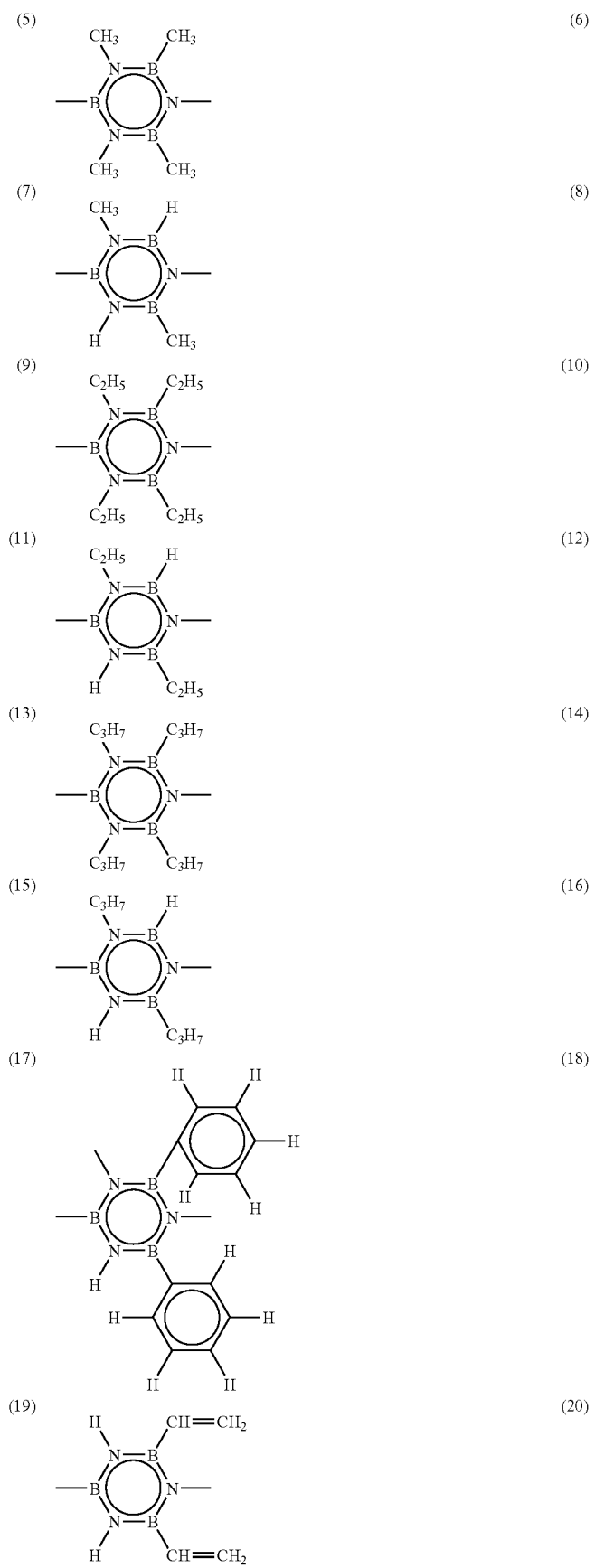

-continued
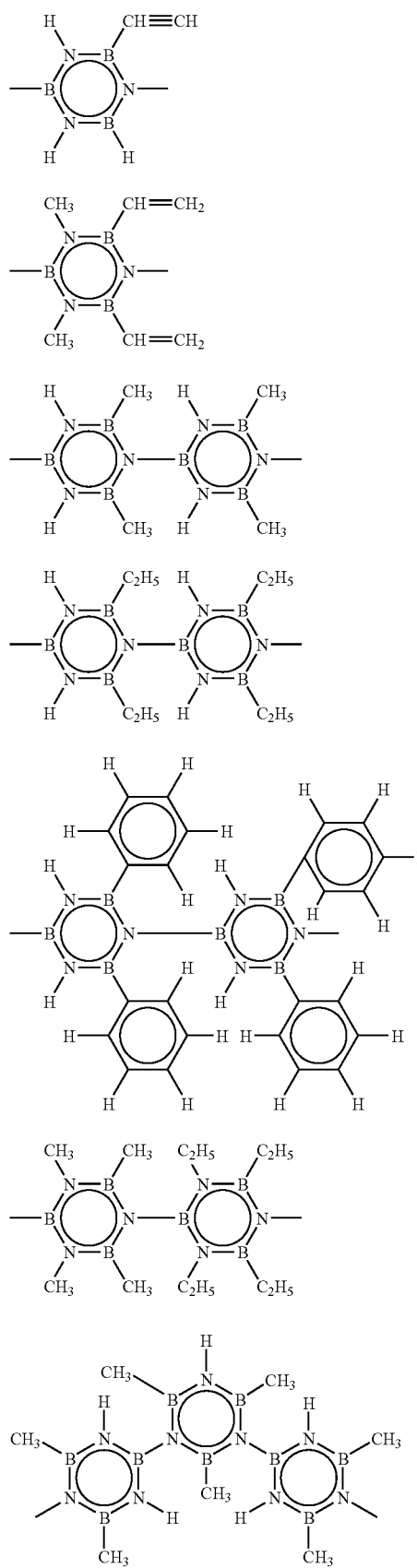
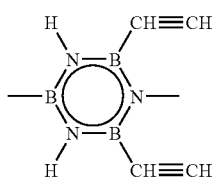
(22)
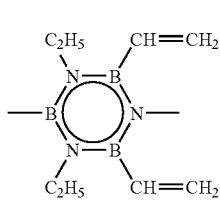
(24)
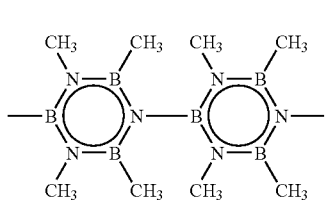
(26)
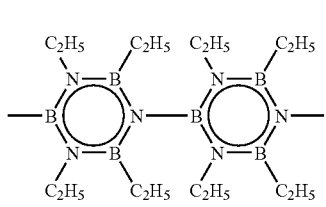
(28)
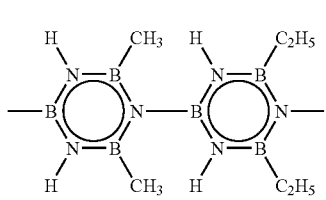
(30)
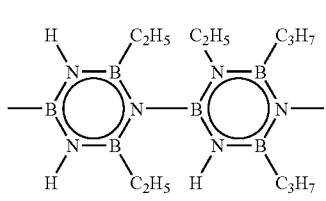
(32)
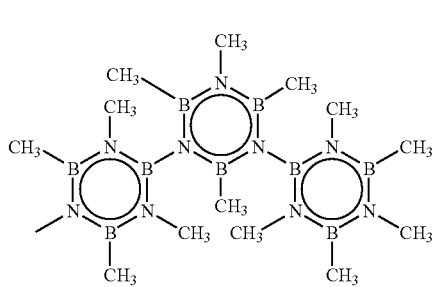
(34)

-continued
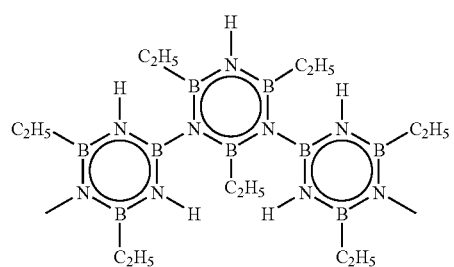
(35)
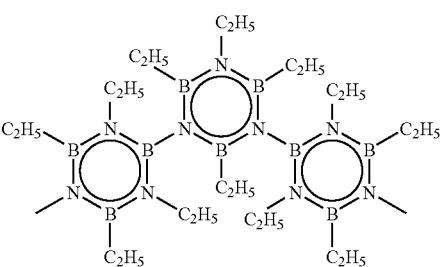
(36)
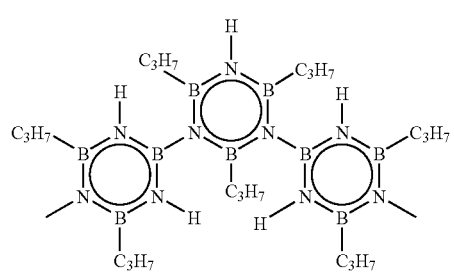
(37)
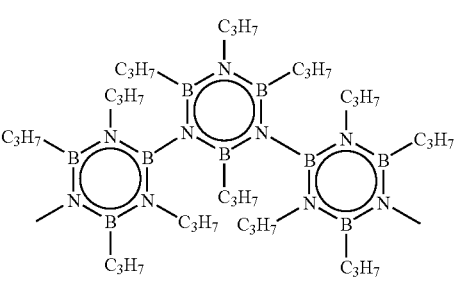
(38)
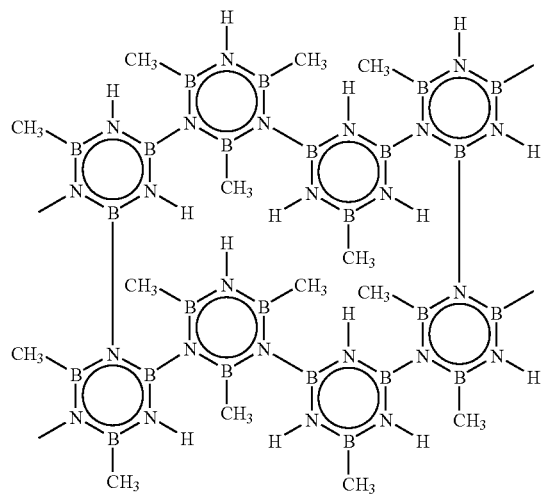
(39)
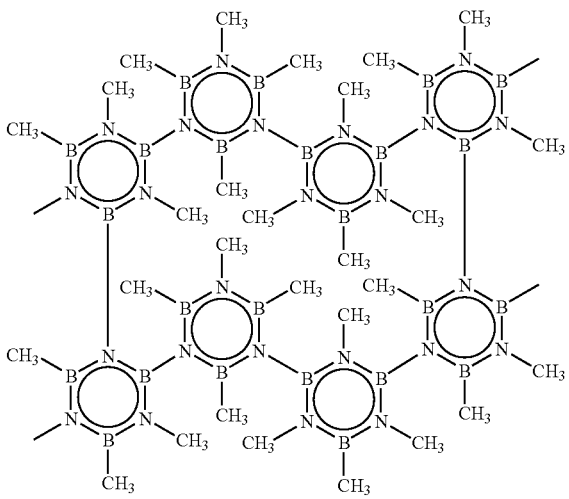
(40)
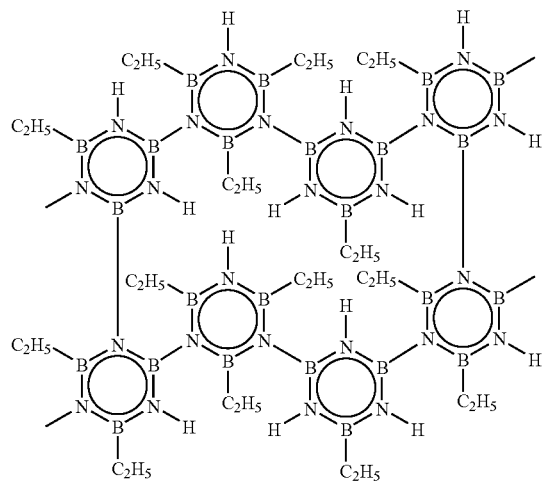
(41)
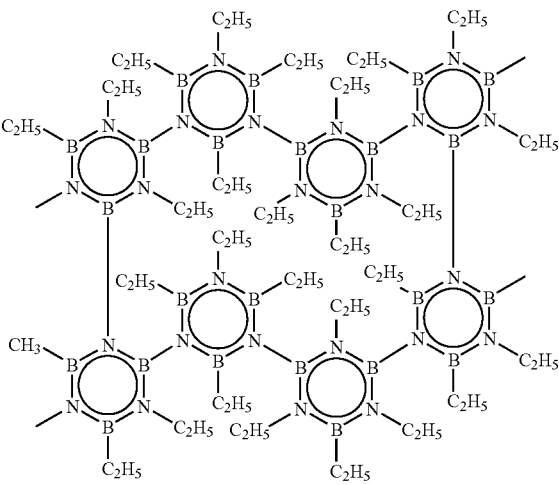
(42)

(43)
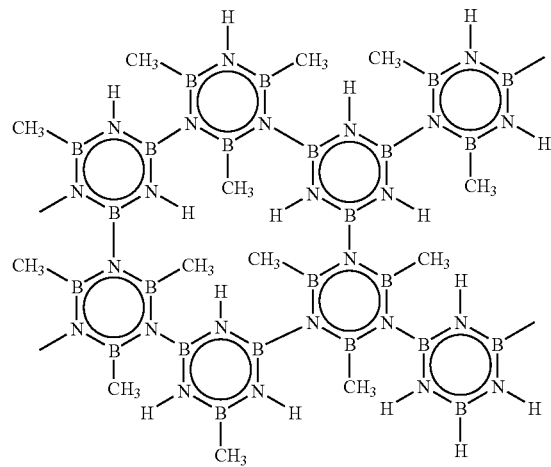
(44)
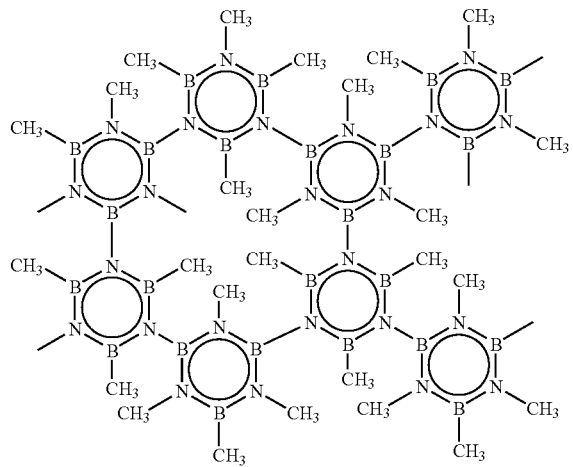
(45)
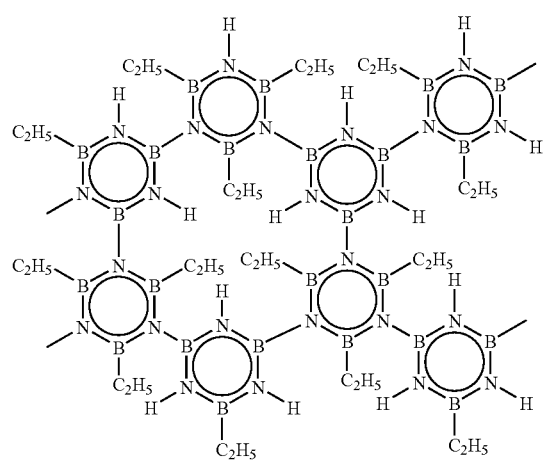
(46)
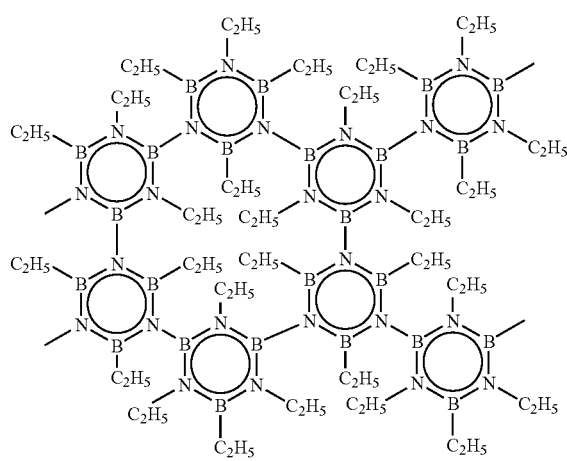
(47)
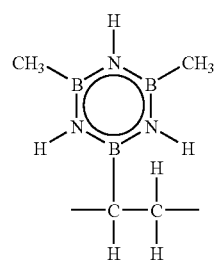
(48)
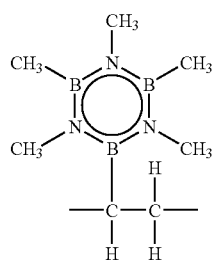
(49)
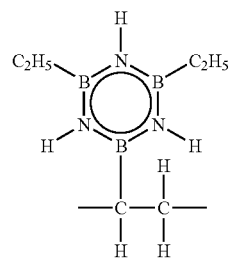
(50)
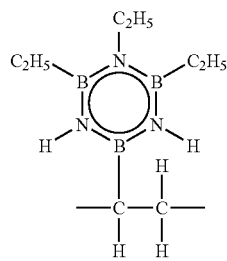

-continued
(51) 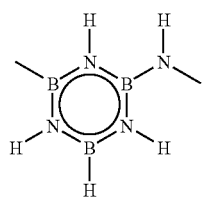
(52) 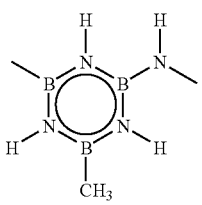
(53) 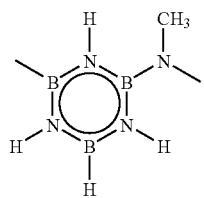
(54) 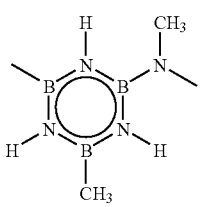
(55) 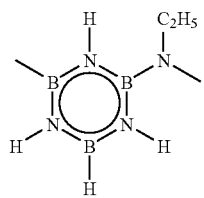
(56) 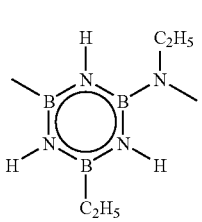
(57) 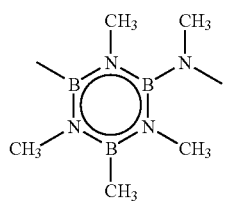
(58) 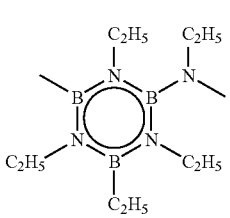
(59) 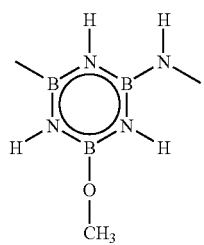
(60) 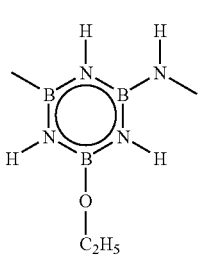
(61) 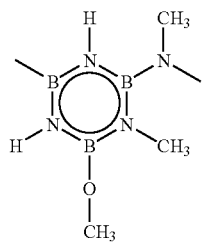
(62) 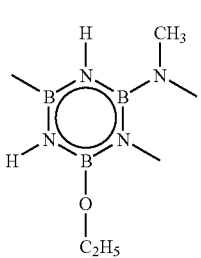
(63) 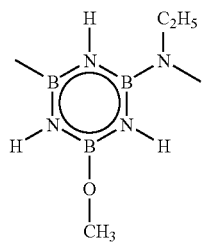
(64) 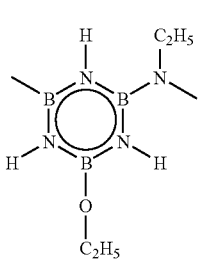

-continued
(65) 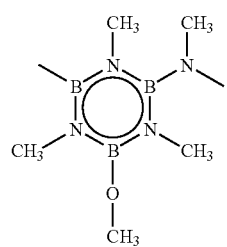
(66) 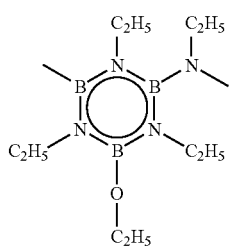
(67) 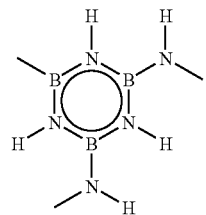
(68) 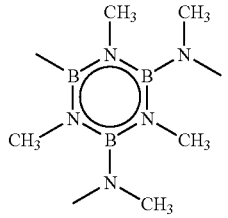
(69) 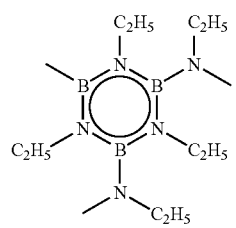
(70) 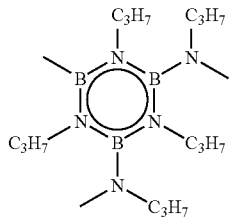
(71) 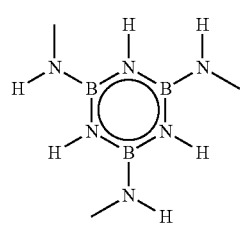
(72) 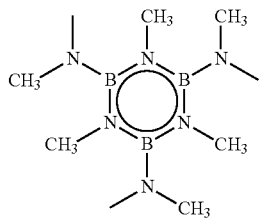
(73) 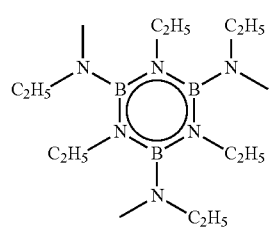
(74) 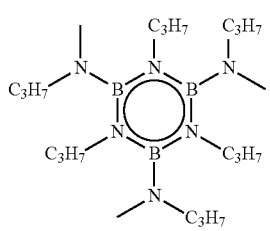
(75) 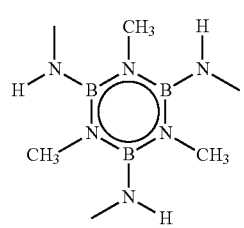
(76) 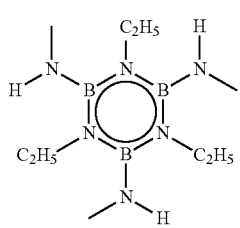
(77) 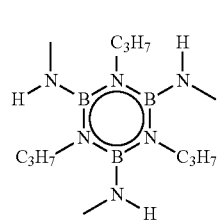
(78) 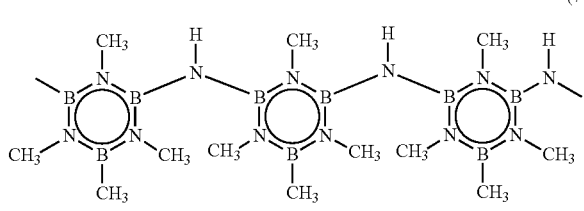

-continued
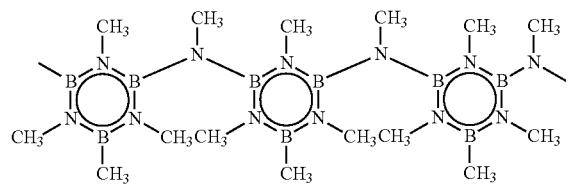
(79)
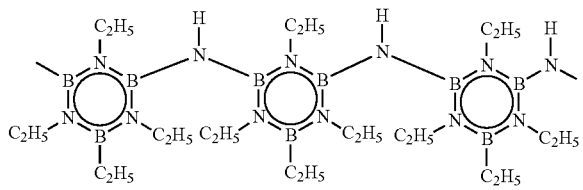
(80)
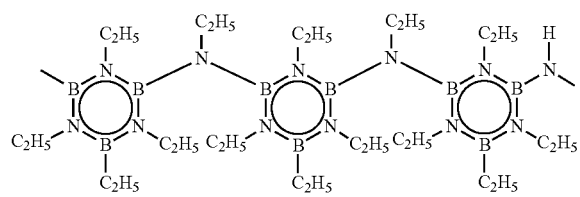
(81)
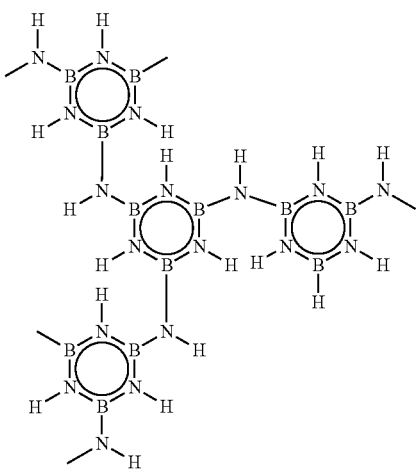
(82)
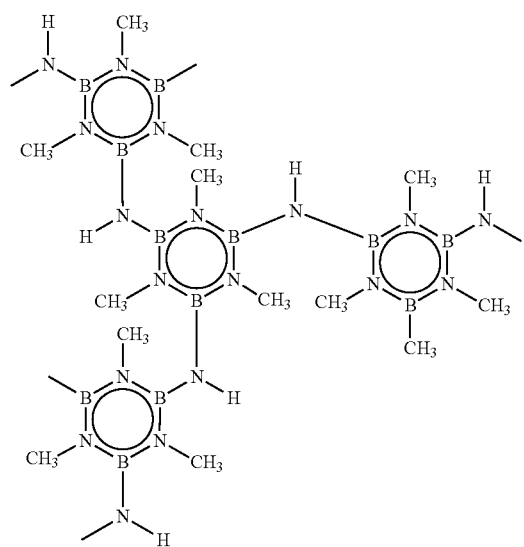
(83)
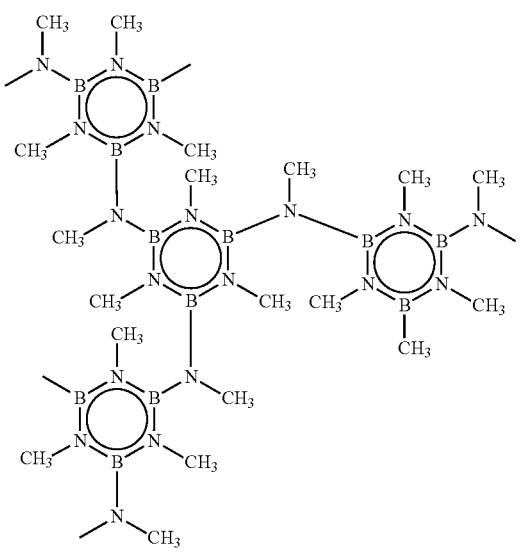
(84)

-continued
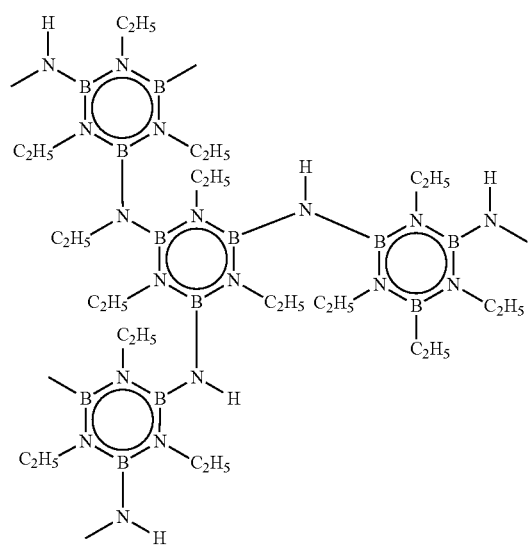
(85)
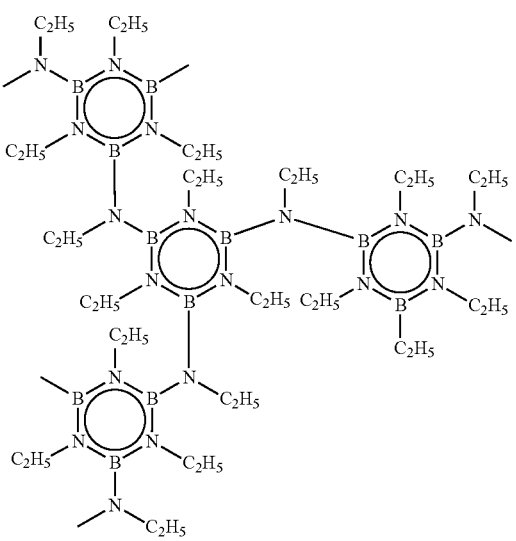
(86)
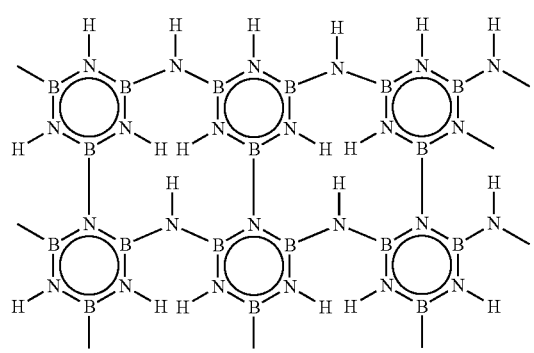
(87)
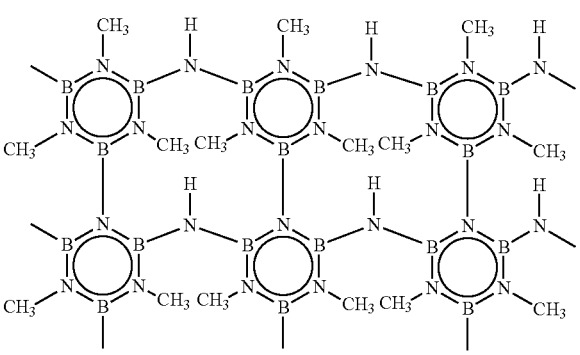
(88)
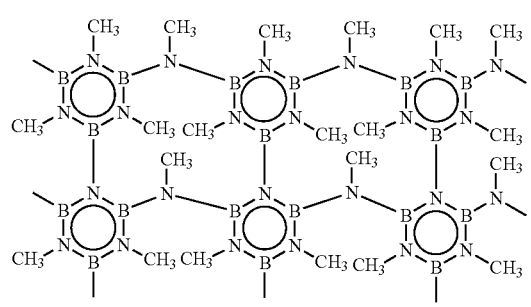
(89)
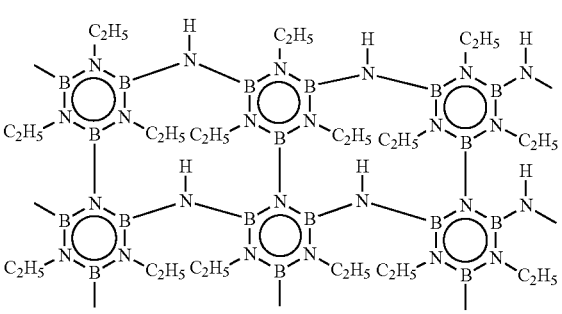
(90)
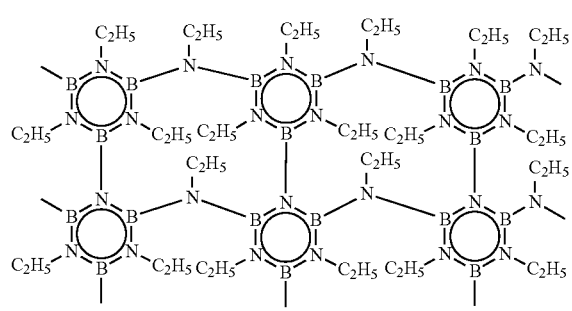
(91)
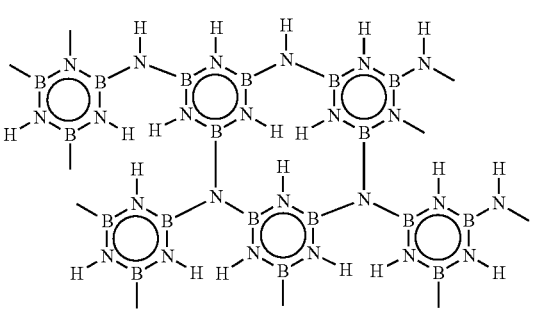
(92)

-continued
(93)
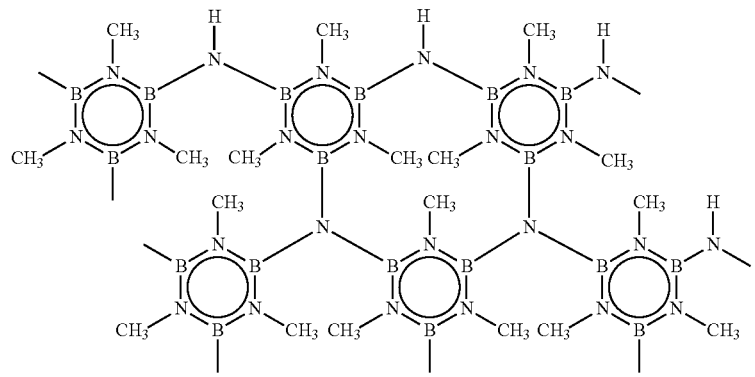
(94)
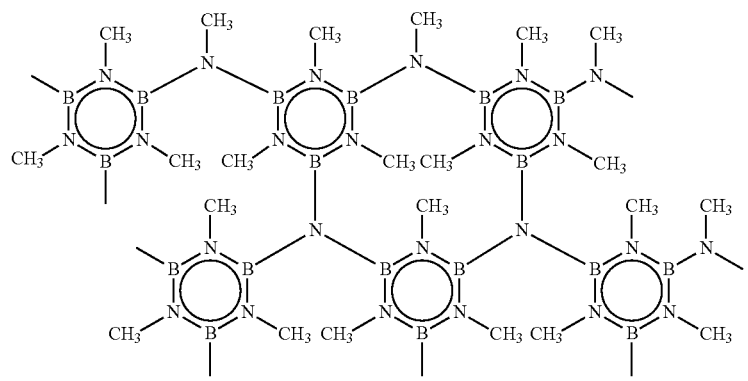
(95)
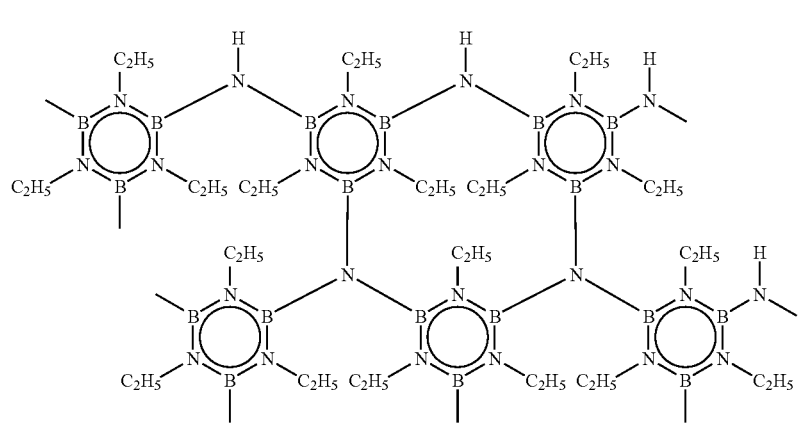
(96)
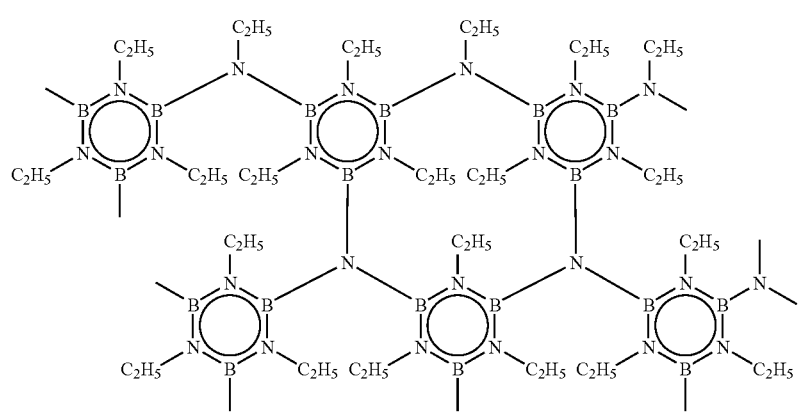

-continued
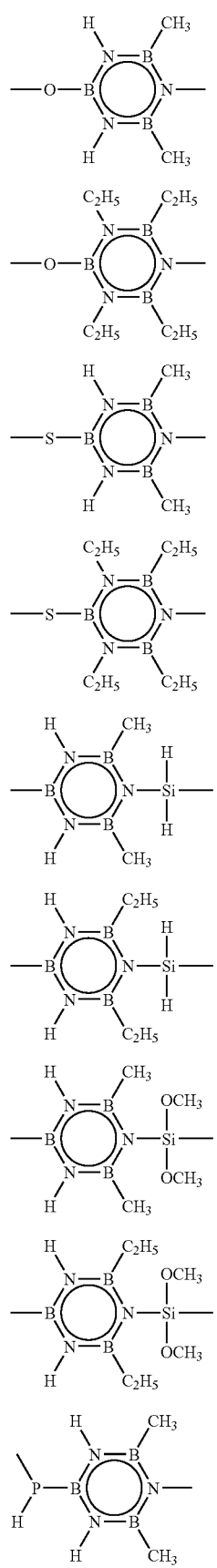
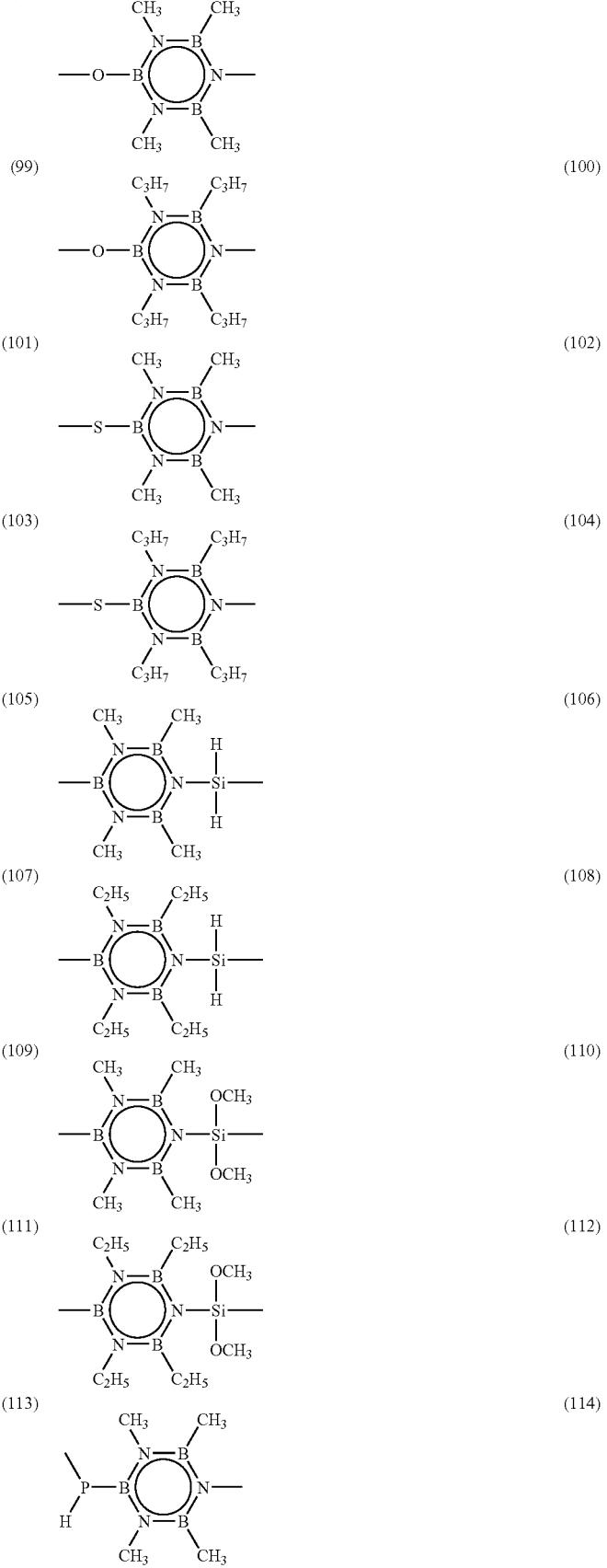

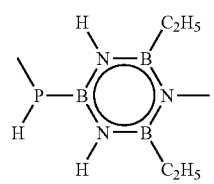
(115)

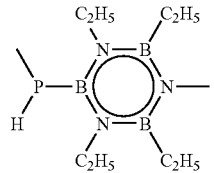
(116)

The low dielectric constant materials according to another embodiment of the present invention are condensates of the substituted borazine (1-2), in other words, compounds having a third borazine skeleton-based structure formed by bonding a first borazine skeleton structure represented by any one of the formulas (2) to (4) with a second borazine skeleton structure represented by any one of the formulas (2) to (4) with elimination of hydrogen atoms from each of the molecules of a substituted borazine to form the third borazine skeleton structure. Examples of the condensates are, for instance, compounds having borazine skeletons structures shown by the above formulas (25) to (28).

The reason why the low dielectric constant material of the present invention can achieve a low dielectric constant is considered that the electronic polarization is decreased by an ionic electronic structure of the borazine skeleton.

Also, a high heat resistance can be achieved by the low dielectric constant materials of the present invention, since inorganic polymeric materials which have of course a higher heat resistance than organic polymeric materials are used.

Further, the reason why the low dielectric constant materials of the present invention have a high water resistance is considered that if $R_1$ to $R_4$ is substituents other than hydrogen atom in the formulas (2) to (4), they firmly bond to boron atom or nitrogen atom in the borazine skeleton and are prevented from reacting with water. Since a hydrogen atom bonding to a boron atom or a nitrogen atom is easily hydrolyzed, it is necessary that in the low dielectric constant material of the present invention, at least one of $R_1$ to $R_4$ in the formulas (2) to (4) is not a hydrogen atom, but a substituent. In particular, since a hydrogen atom bonding to a boron atom causes a hydrolysis reaction more easily as compared with that bonding to a nitrogen atom, it is preferable that a substituent is bonded to a boron atom.

As to the degree of substitution, preferred from the viewpoint of water resistance, of hydrogen atoms on the borazine skeletons included in a molecule which constitutes the low dielectric constant material, assuming that the degree of substitution is 100% if all hydrogen atoms on the borazine skeletons are substituted by a substitutent or substituents shown in the formulas (2) to (4), water resistance equivalent to that for a degree of substitution of 100% is obtained when 30 to 40% of all hydrogen atoms are substituted by a substitutent or substituents shown in the formulas (2) to (4), namely when the degree of substitution is 30 to 40%.

The dielectric constant can be further lowered by introducing fluorine atom (F) into boron nitride. Thus, an insulation layer having a lower dielectric constant can be obtained thereby.

The insulating films of the present invention are obtained by forming the low dielectric constant materials of the present invention into thin films. The insulating films of the present invention are applicable as an interlayer insulating film of semiconductor devices, whereby excellent semiconductor devices can be obtained.

In case of using the low dielectric constant materials in the form of a film, for example, as an interlayer insulating film for semiconductor devices, the film can be formed by coating a solution or dispersion of the low dielectric constant material in a solvent. In that case, the low dielectric constant material may be used in combination with other materials such as other insulating materials which are used preferably in an amount of at most 20% by weight based on the total weight of the low dielectric constant material of the present invention and other materials. Examples of the other materials are, for instance, a known interlayer insulating material for semiconductor devices such as silicate, silazane, silsequioxane, siloxane, silane, polyaryl ether, parylene or polybenzocyclobutadiene, a general insulating material such as adamantane, norbornene, polyimide, polyester, polystyrene, polymethylstyrene, polymethyl acrylate, polymethyl methacrylate or polycarbonate, an amine such as cyclohexylamine, aniline or ethylamine, a surface active agent, and the like. The coating to a substrate can be conducted by spray coating, dip coating, spin coating or other known coating methods. The solvent or dispersing medium includes, for instance, acetone, benzene, glyme, tetrahydrofuran, chloroform and other organic solvents capable of dissolving or dispersing the low dielectric constant materials. The concentration is preferably from 10 to 30% by weight. Preferably, after drying the coated film, the dried film is further heat-treated to cure the film at a temperature of 300 to 450° C., preferably 350 to 400° C. The thickness of the insulating film is preferably from 0.3 to 0.8 μm.

In case of using the low dielectric constant materials as a film such as an interlayer insulating film for semiconductor devices, thin films can also be formed according to procedures as described for example in S. V. Nguyen, T. Nguyen, H. Treichel and O, Spindler, J. Electrochem. Soc., Vol. 141, No. 6, 1633-1638 (1994); W. F. Kane, S. A. Cohen, J. P. Hummel and B. Luther, J. Electrochem. Soc., Vol. 144, No. 2, 658-663 (1997); and M. Maeda and T. Makino, Japanese Journal of Applied Physics, Vol. 26, No. 5, 660-665 (1987). For example, the insulating film or layer can be obtained by subjecting a mixture of diborane ($B_2H_6$), ammonia ($NH_3$) and methane or a mixture of borazine ($B_3H_3N_6$), nitrogen ($N_2$) and methane as a raw material a chemical vapor deposition method (CVD method), thereby causing a condensation reaction.

In case that the low dielectric constant materials are used in the form of a bulk body as a low dielectric constant substrate, the materials are molded by casting into a mold and heat-treating the resulting molded article. The low dielectric constant material to be cast may be used in combination with other materials as mentioned above. The content of other materials is at most 20% by weight.

The insulating films of the present invention applicable to various electronic parts as an interlayer insulating film for semiconductor devices, as a barrier metal layer or etch stopper layer, and as an IC substrate.

Thus, the present invention provides semiconductor devices including an insulating layer or film made of the low dielectric constant materials of the present invention.

In an embodiment of the semiconductor devices according to the present invention, a first insulating layer having a first copper conductive layer disposed to form a lower wiring and a third insulating layer having a third copper conductive layer disposed to form an upper wiring are stacked on the surface of a semiconductor substrate through a second insulating layer interposed therebetween and having a second copper conductive layer communicating with both the first copper conductive layer and the third copper conductive layer so as to electrically connect the lower wiring with the upper wiring. In this embodiment, at least one of the first, second and third insulating layers is made of an insulating material containing the low dielectric constant material of the present invention.

In another embodiment of the semiconductor devices according to the present invention, a first insulating layer having a first copper conductive layer disposed to form a lower wiring and a second insulating layer having a third copper conductive layer disposed to form an upper wiring and having a second copper conductive layer communicating with both the first copper conductive layer and the third copper conductive layer so as to electrically connect the lower wiring with the upper wiring are stacked on the surface of a semiconductor substrate through an insulating film interposed therebetween, the second copper conductive layer also extending through the insulating film. In this embodiment, the insulating film interposed between the first and second insulating layers is made of an insulating material containing the low dielectric constant material of the present invention.

Since the insulating layer or film made of an insulating material containing the low dielectric constant material of the present invention is used in the above semiconductor devices instead of conventional built-up films of silicon oxide and silicon nitride, the wiring capacitance can be reduced.

Also, since the insulating layer or film is made of an insulating material containing the low dielectric constant material of the present invention which has a copper diffusion preventing function, it is not needed to use a barrier metal layer at connecting hole portions and, therefore, a low resistant wiring can be obtained and it is possible to operate the semiconductor devices at high speed.

In the above embodiments, the first, second and third conductive layers are made of copper and, therefore, the wiring delay can be decreased as compared with the use of aluminum, but the materials of the conductive layers are not limited copper.

An example of the wiring structure of semiconductor devices according to the present invention is shown in FIG. 1. In the figure, numeral 1 denotes a semiconductor substrate made of silicon, and numeral 19 denotes an insulating layer made of silicon oxide. On the silicon oxide insulating layer 19 is formed an insulating layer 20 having a thickness of 0.3 μm and made of a crosslinked poly(B-methylaminoborazine) which is a low dielectric constant material according to the present invention. The insulating layers 19 and 20 constitute the first insulating layer.

In the insulating layer 20 is formed a first trench 3 having a width of 0.2 μm and a depth of 0.2 μm in the pattern of a first wiring. A first copper conductive layer 5 is filled in the trench 3. A second insulating layer 21 having a thickness of 0.5 μm made of the crosslinked poly(B-methylaminoborazine) is formed on the insulating layer 20 and the first copper conductive layer 5. In the second insulating layer 21 is formed a hole 8 having a diameter of 0.15 μm and extending to the first copper conductive layer 5, and the hole 8 is filled with copper to form a second copper conductive layer 10 so as to contact the first copper conductive layer 5.

On the insulating layer 21 is formed a third insulating layer 22 having a thickness of 0.2 μm made of the crosslinked poly(B-methylaminoborazine). In the third insulating layer 22 is formed a second trench 12 having a depth of 0.2 μm in the pattern of a second wiring. The bottom of the trench 12 extends to the insulating layer 21, and copper is filled in the trench 12 to form a third copper conductive layer 13. An insulating film 23 made of the crosslinked poly(B-methylaminoborazine) is formed on the insulating layer 22 and the third copper conductive layer 13.

Figure 6:
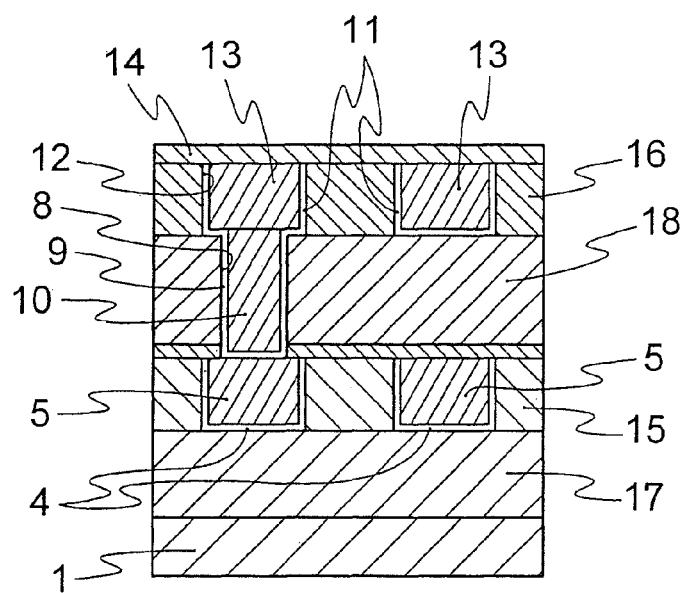
FIG. 6 is a sectional view showing a wiring structure of a conventional semiconductor device.

In semiconductor devices having such a structure, all copper conductive layers, that is, the first copper conductive layer 5, the second copper conductive layer 10 and the third copper conductive layer 13, are in contact with the insulating layers 20, 21 and 22 and film 23 made of an insulating material comprising the low dielectric constant material of the present invention. Thus, copper diffusion from the conductive layers can be prevented from occurring. Furthermore, since the insulating layers 20, 21, 22 and 23 have a dielectric constant of 2.2 and also do not require a barrier metal layer, the wiring capacitance can be reduced as compared with conventional wiring structure shown in FIG. 6, whereby high speed operation of semiconductor devices can be ensured.

Figure 2:
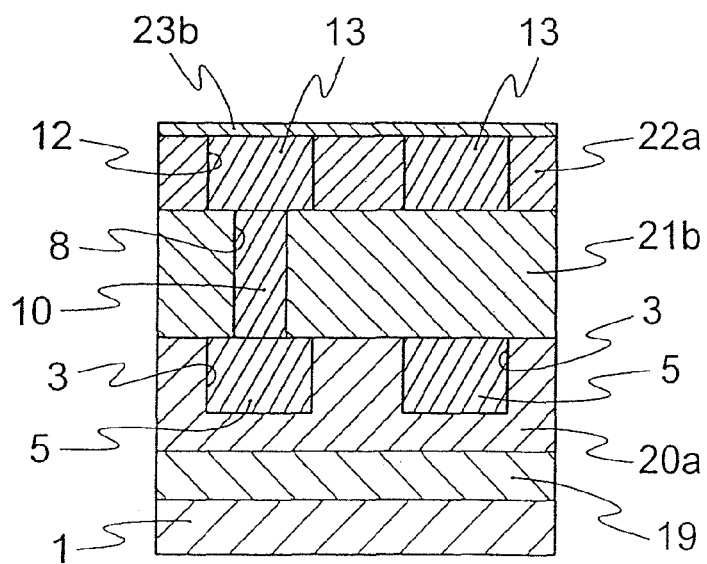
FIG. 2 is a sectional view showing a wiring structure of a semiconductor device according to an embodiment of the present invention.

FIG. 2 is a sectional view of a semiconductor device showing a further embodiment of the present invention. An insulating layer 19 made of silicon oxide is formed on a silicon semiconductor substrate 1. On the silicon oxide insulating layer 19 is formed an insulating layer 20a having a thickness of 0.3 μm and made of an amorphous crosslinked poly(B-methylaminoborazine) which is a low dielectric constant material according to the present invention. The insulating layers 19 and 20a constitute the first insulating layer.

In the insulating layer 20a is formed a first trench 3 having a width of 0.2 μm and a depth of 0.2 μm in the pattern of a first wiring. A first copper conductive layer 5 is filled in the trench 3. A second insulating layer 21b having a thickness of 0.5 μm made of a mixture of microcrystalline and amorphous crosslinked poly(B-methylaminoborazine) is formed on the insulating layer 20a and the first copper conductive layer 5. In the second insulating layer 21b is formed a hole 8 having a diameter of 0.15 μm and extending to the first copper conductive layer 5, and the hole 8 is filled with copper to form a second copper conductive layer 10 so as to contact the first copper conductive layer 5.

On the insulating layer 21b is formed a third insulating layer 22a having a thickness of 0.2 μm made of the same material as the insulating layer 20a, namely amorphous crosslinked poly(B-methylaminoborazine). In the third insulating layer 22a is formed a second trench 12 having a depth of 0.2 μm in the pattern of a second wiring. The bottom of the trench 12 extends to the insulating layer 21b, and copper is filled in the trench 12 to form a third copper conductive layer 13. An insulating film 23b made of the same material as the insulating layer 21b is formed on the insulating layer 22a and the third copper conductive layer 13.

In semiconductor devices having such a structure, all copper conductive layers, that is, the first copper conductive layer 5, the second copper conductive layer 10 and the third copper conductive layer 13, are in contact with the insulating layers 20, 21 and 22 and film 23 made of an insulating material comprising the low dielectric constant material of the present invention. Thus, copper diffusion from the conductive layers can be prevented from occurring. Furthermore, since the insulating layers 20, 21, 22 and 23 have a dielectric constant of 2.3 and also do not require a barrier metal layer, the wiring capacitance can be reduced as compared with conventional wiring structure shown in FIG. 6, whereby high speed operation of semiconductor devices can be ensured.

Figure 3:
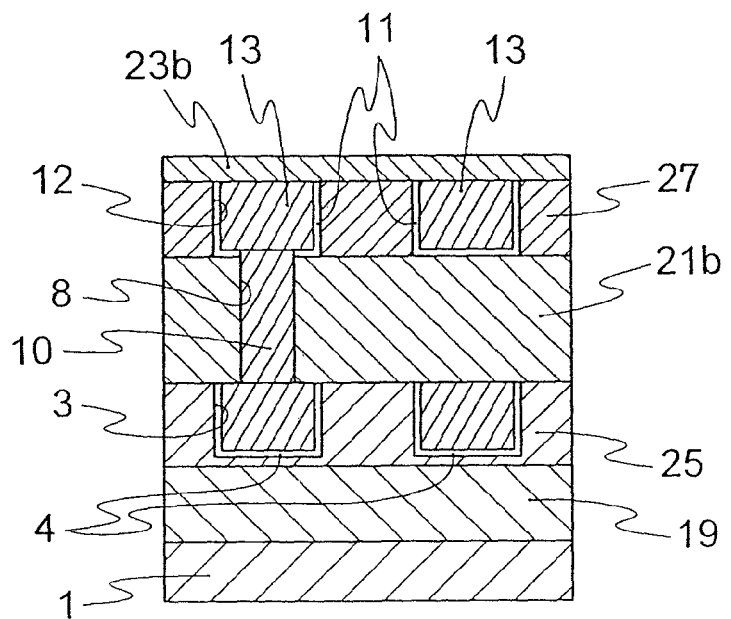
FIG. 3 is a sectional view showing a wiring structure of a semiconductor device according to an embodiment of the present invention.

FIG. 3 is a sectional view of a semiconductor device showing another embodiment of the present invention. An insulating layer 19 made of silicon oxide is formed on a silicon semiconductor substrate 1. On the silicon oxide insulating layer 19 is formed an insulating layer 25 having a thickness of 0.2 μm and made of a poly(aryl ether). The insulating layers 19 and 25 constitute the first insulating layer. In the insulating layer 25 is formed a first trench 3 having a width of 0.2 μm and a depth of 0.2 μm in the pattern of a first wiring. A first copper conductive layer 5 is filled in the trench 3.

A first conductive film (barrier metal film) 4 having a diffusion preventive function is formed so as to cover the surface of the trench 3. The barrier metal film 4 is made of tantalum nitride and has a thickness within the range of 10 to 20 nm. Copper is filled in the trench 3 covered with the barrier metal film 4 to form a first copper conductive layer 5.

A second insulating layer 21b having a thickness of 0.5 μm made of a mixture of microcrystalline and amorphous crosslinked poly(B-methylaminoborazine), which is the low dielectric constant material of the present invention, is formed on the insulating layer 25 and the first copper conductive layer 5. In the second insulating layer 21b is formed a hole 8 having a diameter of 0.15 μm and extending to the first copper conductive layer 5, and the hole 8 is filled with copper to form a second copper conductive layer 10 so as to contact the first copper conductive layer 5.

On the insulating layer 21b is formed a third insulating layer 27 made of the same material as that of the insulating layer 25, i.e., poly(aryl ether), and having a thickness of 0.2 μm. In the third insulating layer 27 is formed a second trench 12 having a depth of 0.2 μm in the pattern of a second wiring. The bottom of the trench 12 extends to the insulating layer 21b. A second conductive film (barrier metal film) 11 having a diffusion preventive function against copper is formed so as to cover the inner surface of the trench 12. The barrier metal film 11 has the same composition and the same thickness as those of the barrier metal film 4. Copper is filled in the trench 12 covered with the barrier metal film 11 to form a third copper conductive layer 13. An insulating film 23b made of the same material as the insulating layer 21b is formed on the insulating layer 27 and the third copper conductive layer 13.

In semiconductor devices having such a structure, the first copper conductive layer 5 is in contact with the barrier metal film 4 and the insulating layer 21b, and the third copper layer 13 is in contact with the barrier metal film 11 and the insulating layer 23b. Further, the second copper conductive layer 10 is in contact with the barrier metal 11 and the insulating layer 21b. Because of having such a structure, diffusion of copper from the conductive layers can be prevented. Moreover, since the insulating layers 25 and 27 made of poly(aryl ether) have a dielectric constant of 2.8 and the insulating layers 21b and 23b made of crosslinked poly(B-methylaminoborazine) have a dielectric constant of 2.2, the wiring capacitance can be reduced to a level lower than that achieved by a conventional wiring structure shown in FIG. 6, whereby a high speed operation of semiconductor devices is made possible. Further, since the insulating layers 25 and 27 are made of poly(aryl ether) and the insulating layers 21b and 23b are made of crosslinked poly(B-methylaminoborazine), the etching selective ratio is high and accordingly it is possible to form wiring having a good shape.

In this embodiment, the layer in which second copper conductive layer 10 is provided, i.e., insulating layer 21b, is formed from a crosslinked poly(B-methylaminoborazine). Substantially the same effect can be obtained also when the layer provided with the first or third copper conductive layer 5 or 13, i.e., insulating layer 25 or 27, is formed from the crosslinked poly(B-methylaminoborazine).

Figure 4:
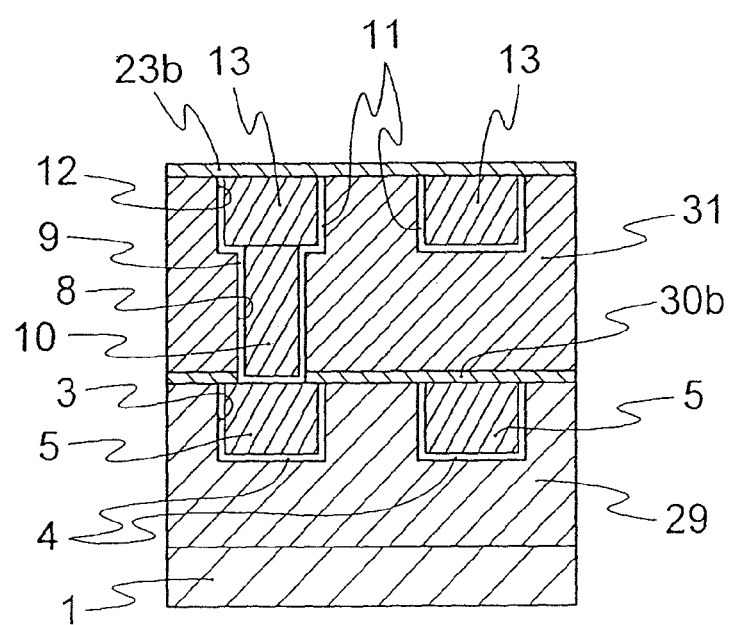
FIG. 4 is a sectional view showing a wiring structure of a semiconductor device according to an embodiment of the present invention.
Figure 5:
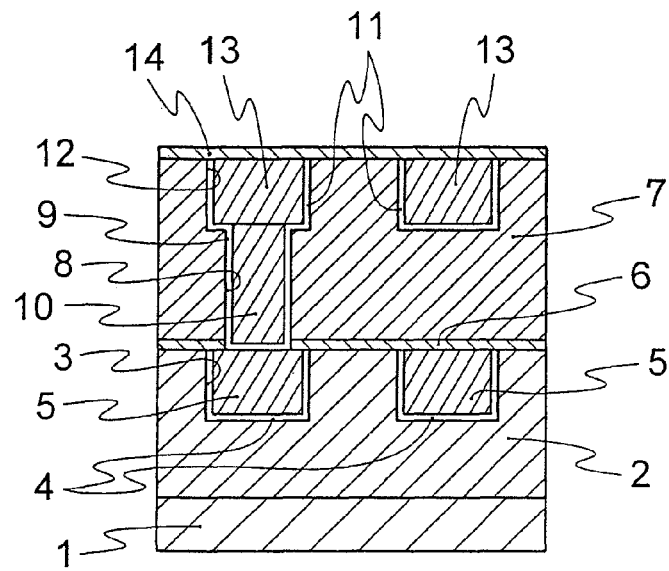
FIG. 5 is a sectional view showing a wiring structure of a conventional semiconductor device.

Another example of the wiring structure of semiconductor devices using the low dielectric constant material of the present invention as an insulating film or layer is shown in FIG. 4. A first insulating layer 29 made of silicon oxide is formed on a silicon semiconductor substrate 1. In the insulating layer 29 is formed a trench 3 having a width of 0.2 μm and a depth of 0.2 μm in the pattern of a first wiring. A first conductive film (barrier metal film) 4 having a diffusion preventive function is formed so as to cover the surface of the trench 3. The barrier metal film 4 is made of tantalum nitride and has a thickness within the range of 10 to 20 nm. Copper is filled in the trench 3 covered with the barrier metal film 4 to form a first copper conductive layer 5.

An insulating layer 30b having a thickness of 0.05 μm made of a mixture of microcrystalline and amorphous crosslinked poly(B-methylaminoborazine), in other words, microcrystals-containing amorphous crosslinked poly(B-methylaminoborazine), which is the low dielectric constant material of the present invention, is formed on the insulating layer 29 and the first copper conductive layer 5.

On the insulating layer 30b is formed a second insulating layer 31 made of silicon oxide. In the second insulating layer 31 are formed a hole 8 having a diameter of 0.15 μm and a trench 12 having a depth of 0.2 μm and a second wiring pattern. The hole 8 extends from the first conductive layer 5 to the trench 12 formed in the surface region of the insulating layer 31 through the insulating layer 30b and the insulating layer 31. Second and third conductive films (barrier metal films) 9 and 11 made of tantalum nitride having a diffusion preventive function are formed so as to cover the surfaces of the hole 8 and the trench 12. Copper is filled in the hole 8 and the trench 12 to form second copper conductive layer 10 and third copper conductive layer 13, respectively. The barrier metal film is also formed at the interface between the first copper conductive layer 5 and the second copper conductive layer.

An insulating film 23b made of the same material as the insulating layer 30b is formed on the insulating layer 31 and the third copper conductive layer 13.

In semiconductor devices having such a structure, the first, second and third copper conductive layers 5, 10 and 13 are in contact with the barrier metal films 4, 9 and 11 and the insulating layers 23b and 30b. Thus, diffusion of copper from the conductive layers 5, 10 and 13 can be prevented. Moreover, since the insulating layers 23b and 30b have a dielectric constant of 2.2 and the insulating layers 29 and 31 have a dielectric constant of 4.2, the wiring capacitance can be reduced to a level lower than that achieved by a conventional wiring structure shown in FIG. 6, whereby a high speed operation of semiconductor devices is made possible.

The present invention is more specifically described and explained by means of the following examples.

EXAMPLE 1

Soluble poly(B-trimethylborazilene) was synthesized according to Fazen et al's method disclosed in Fazen et al., Chem. Mater., Vol. 7, p 1942, 1995.

Tetraglyme was used as a solvent, and B-trimethylborazine was heated in an Ar gas at 220° C. for two weeks with stirring and degassing to give a highly viscous liquid. The liquid was evaporated to give a white powder of a low dielectric constant material according to the present invention.

This material had a chemical structure shown by the following formula (117):

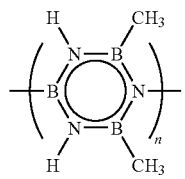
(117)

and had an average molecular weight (Mn) of about 7,500.

The obtained low dielectric constant material was dissolved in acetone and coated by spin coating method onto a quartz plate on which gold was deposited to form a counter electrode. The coated film was then dried at 100° C. for 10 minutes and heated at 400° C. for 10 minutes to give an insulating film according to the present invention. The thus heat-treated film was made of a partially crosslinked poly(B-methylboradine). Gold was deposited onto the obtained insulating film as a main electrode.

EXAMPLE 2

Synthesis of soluble poly(B-triethylborzilene) was carried out in the same manner as Example 1.

Tetraglyme was used as a solvent, and B-triethylborazine was heated in an Ar gas at 220° C. for two weeks with stirring and degassing to give a highly viscous liquid. The liquid was evaporated to give a white powder of a low dielectric constant material according to the present invention.

This material had a chemical structure shown by the following formula (118):

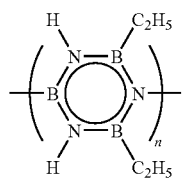
(118)

and had an average molecular weight (Mn) of about 5,500.

An insulating film was formed from the obtained low dielectric constant material by conducting the spin coating in the same manner as in Example 1 and drying at 100° C. for 10 minutes. Gold was then deposited onto the insulating film as a main electrode.

EXAMPLE 3

A white powder of poly(methylborazinylamine) was prepared according to Narula et al's method disclosed in C. K. Narula, R. Schaeffer, R. T. Paine, A. K. Datye and W. F. Hammetter, J. Am. Chem. Soc., Vol. 109, p 5556 (1987). The thus obtained low dielectric constant material was dispersed into acetone, and the dispersion was coated by spin coating and dried at 100° C. for 10 minutes in the same manner as in Example 1 to give an insulating film. Gold was then deposited thereon as a main electrode.

EXAMPLE 4

A white powder of poly(B-methylaminoborazine) was prepared according to Kimura et al's method disclosed in Y. Kimura et al., Composites Science and Technology, Vol. 51, p 173 (1994). The thus obtained low dielectric constant material was dispersed into acetone, and the dispersion was coated by spin coating and dried at 100° C. for 10 minutes in the same manner as in Example 1 to give an insulating film. Gold was then deposited thereon as a main electrode.

Dielectric constants of the insulating films obtained in Examples 1 to 4 were measured at 25° C. and 1 MHz by using an impedance analyzer (model 4191A made by Hewlett Packard). In order to evaluate the water resistance, the dielectric constant was also measured with the lapse of time.

The results are shown in Table 1.

COMPARATIVE EXAMPLE

An insulating film was formed from polyboradilene in the same manner as in Example 1, and the dielectric constant thereof was measured. The result is shown in Table 1.

TABLE 1

|  | Dielectric constant | | | |
| --- | --- | --- | --- | --- |
|  | After preparation of sample | After 1 day | After 2 days | After 3 days |
| Example 1 | 2.0 | 2.1 | 2.2 | 2.2 |
| Example 2 | 2.1 | 2.1 | 2.1 | 2.1 |
| Example 3 | 2.2 | 2.2 | 2.2 | 2.2 |
| Example 4 | 2.1 | 2.1 | 2.1 | 2.2 |
| Com. Ex. | 2.0 | 3.5 | 4.2 | 4.5 |

The insulating films obtained in Examples 1 to 4 have a dielectric constant of at most 2.4. From these results, it is understood that a substrate having a low dielectric constant can be obtained.

Also, these polymeric borazine compounds can be graphitized by heating at a temperature of 1,000 to 1,200° C. (Application View of Inorganic Polymer, p 70, 1990, supervised by Naruyuki Kajiwara). Thus, these insulating films have a thermal resistance of at least 450° C.

Further, as apparent from the results shown in Table 1, the films obtained in Examples 1 to 4 show no or little change in dielectric constant with the lapse of time. Thus, it is understood that these films have an excellent water resistance.

What we claim is:

1. A source material for preparing a low dielectric constant material comprising an oligomer or polymer having a borazine skeleton structure represented by the formula (117) or (118):

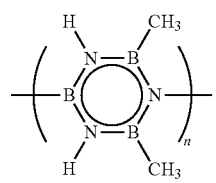
(117)

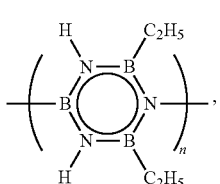
(118)

wherein n is an integer of two or more,
each of said oligomer and polymer being a condensate of B-trimethylborazine or B-triethylborazine.

2. A low dielectric constant material comprising an oligomer or polymer having a borazine skeleton structure represented by the formula (117) or (118):

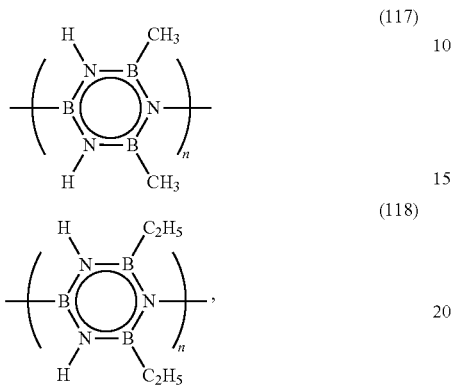

wherein n is an integer or two or more,
each of said oligomer and polymer being a condensate of B-trimethylborazine or B-triethylborazine.

* * * * *